United States Patent [19]
Yoshida

[11] 4,323,767
[45] Apr. 6, 1982

[54] REPEATEDLY OPERABLE TIMER

[75] Inventor: Kunio Yoshida, Nara, Japan

[73] Assignee: Sharp Kabushiki Kaisha, Osaka, Japan

[21] Appl. No.: 906,787

[22] Filed: May 17, 1978

[30] Foreign Application Priority Data

May 20, 1977 [JP] Japan .................. 52-59219

[51] Int. Cl.³ ............................................. H03K 27/00
[52] U.S. Cl. ............................. 235/92 SH; 235/92 T
[58] Field of Search ............ 235/92 T, 92 PE, 92 SH, 235/92 DP, 92 NG; 58/23 R, 24 R; 368/89, 108, 120

[56] References Cited

U.S. PATENT DOCUMENTS

| | | | |
|---|---|---|---|
| 3,581,066 | 5/1971 | Maure et al. | 235/92 PE |
| 3,800,253 | 3/1974 | Bryant | 235/92 PE |
| 3,824,378 | 7/1974 | Johnson et al. | 235/92 PE |
| 3,909,791 | 9/1975 | van den Berg | 235/92 PE |

*Primary Examiner*—Joseph M. Thesz
*Attorney, Agent, or Firm*—Birch, Stewart, Kolasch & Birch

[57] ABSTRACT

A repeatedly operable timer is adapted such that preselected time information is reloaded automatically upon lapse of that preselected time information. There are provided an input unit for introduction of preselectable time information, a first and a second storages for storing the same preselectable time information introduced, a subtractor effecting subtraction at a given interval on the time information stored in the first storage, a detector which detects if the time information in the first storage reaches zero as a result of the subtraction, and a control which permits the time information in the second storage to be transferred into the first storage in response to the output of the zero detector.

2 Claims, 5 Drawing Figures

# REPEATEDLY OPERABLE TIMER

BACKGROUND OF THE INVENTION

The present invention relates to a repeatedly operable timer where previously selected time information is re-established upon the lapse of the selected time information and such operation is repeated until any key or switch is manually operated.

A prior art timer is adapted to store preselectable time information once and, when the remaining time information reaches zero, come to a dead stop. If it was desirable to measure same period of time repeatedly, it was therefore necessary to re-start the time keeping performance immediately after the preselected time period has passed. Practically, this is completely impossible. A repeatedly operable timer is most desirable from an economy standpoint in the case where a charge depends primarily on time like parking charges and telephone charges.

Accordingly, it is an object of the present invention to provide a repeatedly operable timer which measures a time period repeatedly.

In its broadest aspect, the repeatedly operable timer of the present invention is provided with means for loading preselected time information into the timer repeatedly whenever the preselected time information has passed. In one preferred form of the present invention, the repeatedly operable timer includes an input unit for the introduction of preselectable time information, a first and a second storages for storing same preselectable time information introduced, a subtractor which effects subtraction of the time information stored in the first storage at a given interval, a detector which detects if the time information left in the first storage reaches zero as a result of the subtraction, and a control which permits the time information in the second storage to be transferred into the first storage in response to the output of the zero detector.

BRIEF DESCRIPTION OF THE DRAWINGS

Other objects and many of the attendant advantages of the present invention will be easily appreciated as the same becomes better understood by reference to the following detailed description when considered in conjunction with the accompanying drawings in which like reference numerals designate like parts throughout the figures thereof, and wherein.

DETAILED DESCRIPTION OF THE INVENTION

Figure 1:
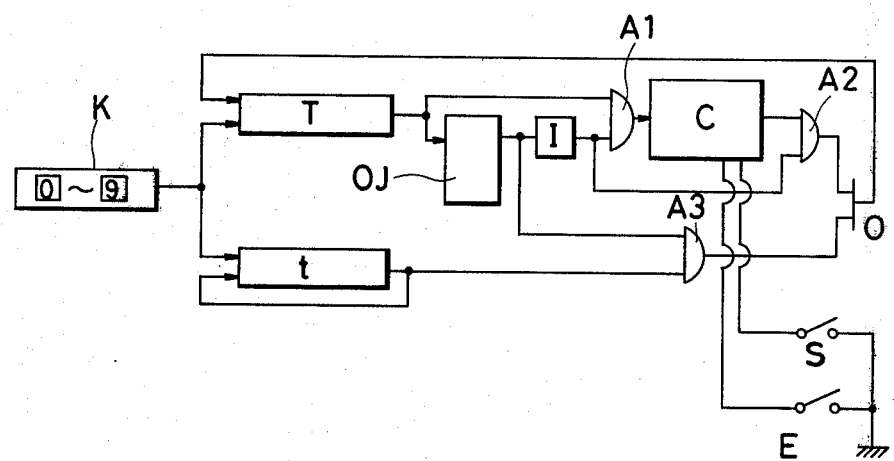
FIG. 1 is a schematic diagram of a repeatedly operable timer of the present invention.

Referring now to FIG. 1, there is illustrated a scheme of the repeatedly operable timer designed according to the present invention. A keyboard K has digit keys $\boxed{0}$ through $\boxed{9}$, etc., for the introduction of preselectable time information. Upon depression of any digit key or keys a pair of storage registers T and t receive and store the time information introduced via the keyboard K. One of the registers T forms a circulating loop in combination an AND gate $A_1$, a timekeeping circuit C, an AND gate $A_2$ and an OR gate O. The timekeeping circuit C effects subtraction on the time information at a given interval. The second register t keeps the time information introduced by the key depression of the keyboard K. If a zero detector OJ associated with the first register T detects zero, then the time information will be transferred from the second register t to the first T. When the detector OJ finds zero, an inverter I disables the AND gates $A_1$ and $A_2$ to shut the circulating loop for the first register T. Two specific keys S and E are connected to the timekeeping circuit C, instructing the timekeeping function to start and end.

With such an arrangement, the time information is introduced and stored in the first and second registers T and t upon the key depression of the keyboard K. When the start key S is depressed, the timekeeping circuit C becomes operable to subtract a given value from the time information loaded into the first register T at a given interval. If the contents of the first register T shows zero as a result of the subtraction, then the zero detector OJ will detect zero so that the circulating loop for the first register T is opened and the contents of the second register t are transferred into the first register T via the AND gate $A_3$ and the OR gate O. The outcome is that the first register T is loaded again with the same time information immediately after the preset time period has passed. The subtraction is re-started at this moment. The above mentioned procedure will be repeated until the function E is depressed to disable the timekeeping circuit C.

Figure 2:
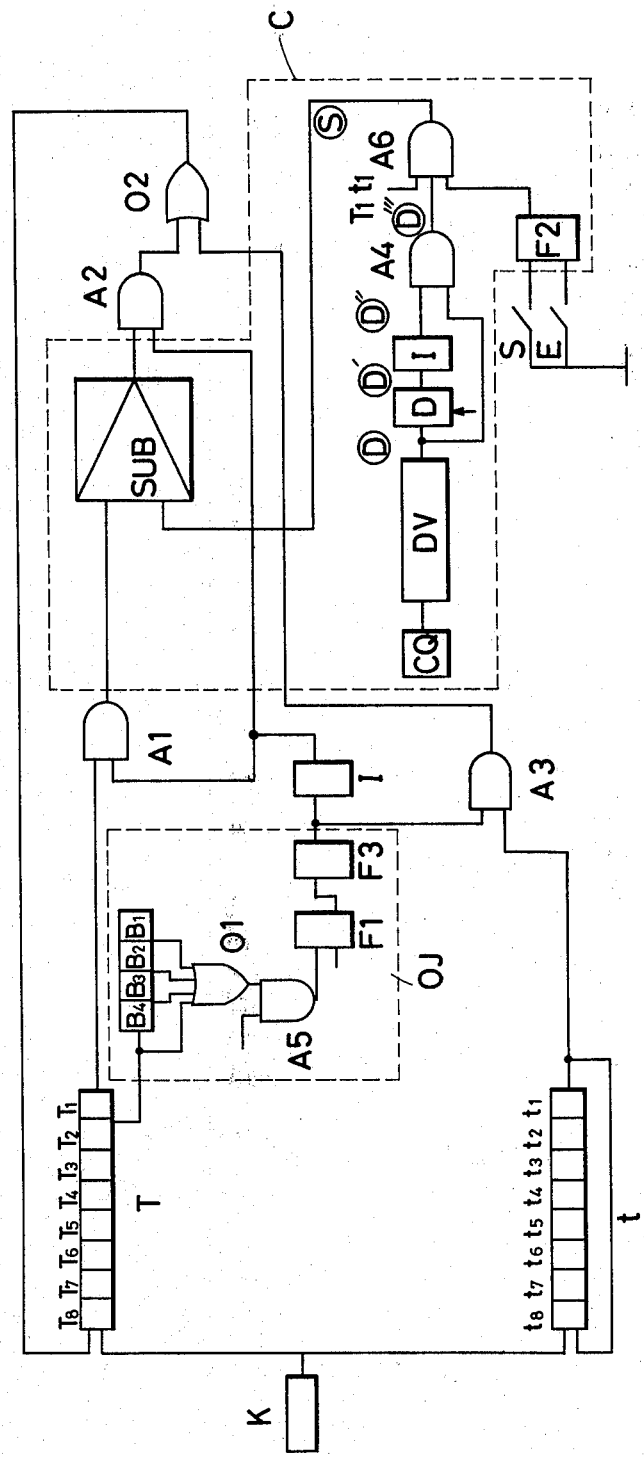
FIG. 2 is a more detailed circuit diagram of the repeatedly operable timer.

FIG. 2 illustrates a more detailed circuit of the repeatedly operable timer. A buffer register $B_1$ through $B_3$ is provided for the zero detecting purposes. The zero detector OJ further includes an OR gate $O_1$, an AND gate $A_5$ connected to a timing signal $t_4$, an R-S type flip flop $F_1$ and a delay type flip flop $F_3$ connected to a clock signal $\phi_C$. When the contents of the register T are not zero, the output of the flip flop $F_3$ is at a low level and the AND gate $A_3$ is not enabled. The AND gate $A_2$ and the OR gate $O_2$ are enabled to circulate the contents of the register T. Contrarily, when the contents of the register T show zero, the output of the flip flop $F_1$ will rise to a high level to enable the AND gate $A_3$. Therefore, the contents of the register t are moved to the register T. A full subtractor SUB subtracts "one" from the contents of the register T whenever an instruction $\text{\textcircled{S}}$ is offered.

Figure 5:
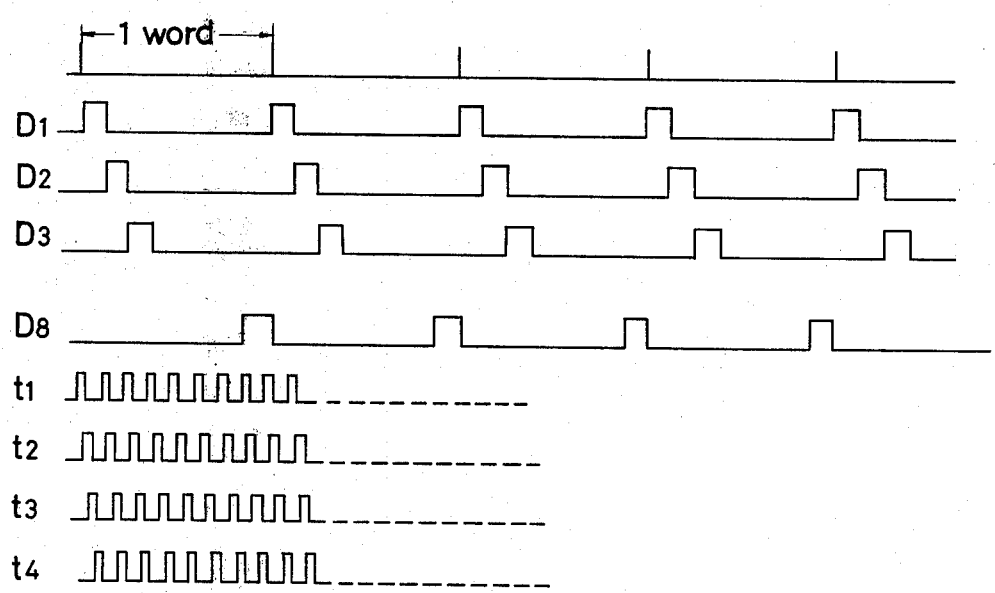
FIGS. 3 through 5 are a flow chart and waveform diagrams associated with the circuit shown in FIG. 2.
Figure 3:
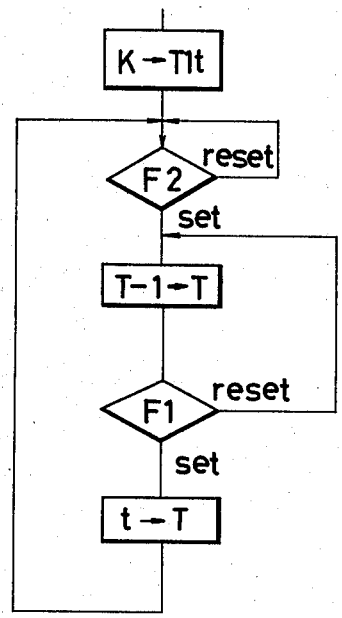
Figure 4:
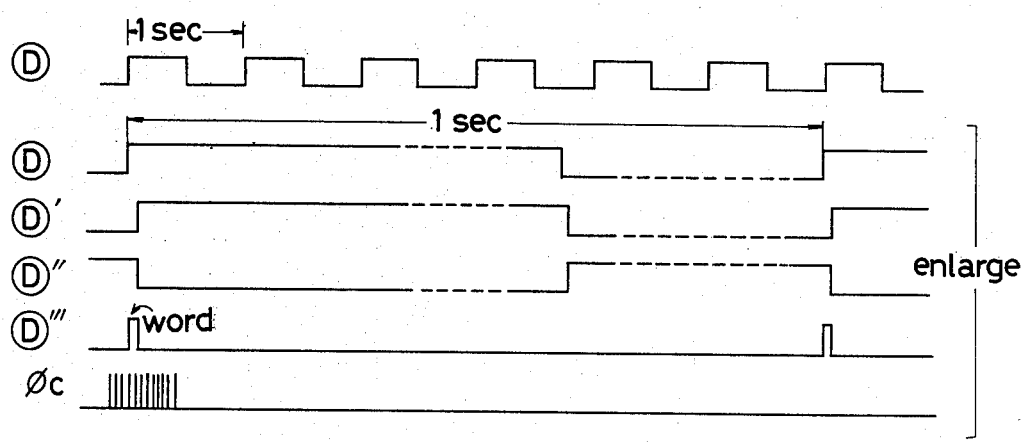

An oscillator CQ and a frequency divider DV form the timekeeping circuit C in a well known manner. It further includes a delay type flip flop D, an inverter I, AND gates $A_4$ and $A_6$ and an R-S type flip flop $F_2$. A standard signal $\text{\textcircled{D}}$ provides a basis for a one-second signal. The subtraction instruction $\text{\textcircled{S}}$ is generated one at an interval of one-second. The flip flop $F_2$ is kept in the reset state from the depression of the key S up to that of the key E, generating the signal $\text{\textcircled{S}}$ via the AND gate $A_6$ to the subtractor SUB. The operation of the circuit shown in FIG. 2 will be more easily understood from reference to a flow chart and waveform diagrams shown in FIGS. 3 through 5. It will be noted that the above mentioned repeatedly operable timer of the invention is effective when incorporated into a combined timepiece and calculator.

The invention being thus described, it will be obvious that the same may be varied in many ways. Such variations are not to be regarded as a departure from the spirit and scope of the invention, and all such modifications are intended to be included within the scope of the following Claims.

What is claimed is:

1. A continuously repeatable timer having a desired repeat time comprising:

circulating loop means including a first storage register, said circulating loop means decrementing an initial count stored in said first storage register corresponding to the desired repeat time and producing an output signal representative thereof;

a second storage register containing information indicative of said desired repeat time;

input means for preselectably introducing said desired repeat time into said first and second storage registers;

a zero detector means for monitoring the output signal produced by said circulating loop means and producing a zero signal each time the output signal produced by said circulation loop means is zero; and means for repeatably placing the contents of said second storage register into said first storage register upon the receipt of each zero signal;

said circulating loop means further including;

subtractor means for decrementing the count in said first storage register, and inhibit means for momentarily stopping the operation of said subtractor means when the zero signal is generated by said zero detector means.

2. A continuously repeatable timer having a desired repeat time comprising:

circulating loop means including a first storage register, said circulating loop means decrementing an initial count stored in said first storage register relating to an elapsed time and producing an output signal representative thereof;

a second storage register containing information indicative of said desired repeat time;

input means for preselectably introducing said desired repeat time into said first and second storage registers;

a preset time elapse detection means for monitoring the output signal produced by said circulating loop means and producing a preset time signal each time the output signal produced by said circulating loop means is equal to a preset time present in said detection means; and means for repeatably placing the contents of said second storage register into said first storage register upon the receipt of each preset time signal;

said circulating loop means further including;

subtractor means for decrementing the count in said first storage register, and inhibit means for momentarily stopping the operation of said subtractor means when the elapsed time signal is generated by said preset time elapse detector means.

* * * * *